United States Patent [19]
Smythe et al.

[11] Patent Number: 5,323,083
[45] Date of Patent: Jun. 21, 1994

[54] CRYSTAL RESONATOR HAVING REDUCED ACCELERATION SENSITIVITY

[75] Inventors: Robert C. Smythe, Orlando, Fla.; Harry F. Tiersten, Schenectady, N.Y.

[73] Assignee: Piezo Technology, Inc., Orlando, Fla.

[21] Appl. No.: 994,456

[22] Filed: Dec. 21, 1992

Related U.S. Application Data

[63] Continuation of Ser. No. 782,679, Oct. 25, 1991, abandoned.

[51] Int. Cl.5 .......................................... H01L 41/08
[52] U.S. Cl. ................................. 310/351; 310/344; 310/346; 310/348; 310/353
[58] Field of Search ............... 310/338, 329, 340, 346, 310/351–353, 324, 344; 23/517 R, 517 AV

[56] References Cited

U.S. PATENT DOCUMENTS

| | | | |
|---|---|---|---|
| 3,069,572 | 12/1962 | Dick et al. | 310/353 |
| 3,339,091 | 8/1967 | Hammond et al. | 310/344 X |
| 4,221,986 | 9/1980 | Besson | 310/353 X |

OTHER PUBLICATIONS

"Chemically Milled VHF and UHF AT-Cut Resonators," by J. R. Hunt and R. C. Smythe, Piezo Technology, Inc.

"Further Advances on B.V.A. Quartz Resonators," by R. J. Bession and U. R. Peier, Freq. Control Symposium, USAERADCOM, May 1980.

"The Acceleration Sensitivity of Quartz, Crystal Oscillators: A Review," by Raymond L. Filler, IEEE Transactions on Ultrasonics, Ferroelectrics, and Frequency Control, vol. 35, No. 3, May 1988.

"On the Influence of Fabrication Imperfection On the Normal Acceleration Sensitivity of Contoured Quartz Resonators With Rectangular Supports," by Y. S. Zhou and H. F. Tiersten Forty-Fourth Annual Symposium on Frequency Control 1990.

"An Analysis of the In-Plain Acceleration Sensitivity of Contoured Quartz Resonators With Rectangular Supports," by H. F. Tiersten and Y. S. Zhou Forty-Fourth Annual Symposium on Frequency Control 1990.

Primary Examiner—Mark O. Budd
Attorney, Agent, or Firm—Darby & Darby

[57] ABSTRACT

A crystal resonator having reduced acceleration sensitivity in which the resonator blank having one or more electrodes thereon has stiffening cover plates mounted to its top and bottom faces and spaced from the resonator blank by sidewalls.

19 Claims, 6 Drawing Sheets

FIG. 10

CRYSTAL RESONATOR HAVING REDUCED ACCELERATION SENSITIVITY

This is a continuation, of application Ser. No. 07/782,679, filed Oct. 25, 1991 now abandoned.

BACKGROUND OF THE INVENTION

A need exists for crystal oscillators and crystal resonators having low acceleration sensitivity, see the article entitled "The Acceleration Sensitivity of Quartz Crystal Oscillators: A Review," IEEE Transactions On Ultrasonics, Ferroelectrics, and Frequency Control, Vol. 35, No. 3, published in May 1988. As is known, piezoelectric resonators, especially devices such as AT and SC cut quartz crystal resonators, are used in a number of applications in which they are subjected to acceleration. This acceleration can be low frequency periodic and/or random vibration to which resonators are subjected while operating. Acceleration causes the resonance frequency of a crystal resonator to change and this is undesired.

It is known from the above cited article that for accelerations which are not too large, the frequency change is the scalar (dot) product of two vector quantities, the acceleration sensitivity of the resonator and the acceleration.

The acceleration sensitivity of a piezoelectric resonator depends upon two factors—the deformation produced by the acceleration and the mode shape. While the mathematical analysis is complex, the basic idea is rather simple, see, Forty-Fourth Annual Symposium on Frequency Control—1990, pps. 452–460, entitled: "On the Influence of a Fabrication Imperfection on the Normal Acceleration Sensitivity of Contoured Quartz Resonators with Rectangular Supports". At each point in the resonator, acceleration-induced deformation alters the effective elastic stiffness of the resonator, thereby incrementally affecting the resonance frequency of each mode of vibration by an amount that depends upon the mode amplitude and sign and upon the amplitude and sign of the deformation at that point. While, in the interest of simplicity, mode amplitude is treated as if it were a single quantity, it should be recognized that the mode of vibration employed may have two or even more components, all of which may contribute to the total acceleration sensitivity. Similarly, the acceleration-induced deformation will, in general, have more than one component.

The total effect on the resonance frequency of the particular mode is the algebraic sum of the incremental effects taken over the entire volume of the resonator. An important aspect of the summation is that, due to symmetry, a high degree of cancellation takes place. That is, the sum of the positive increments is very nearly equal to the sum of the negative increments. As a consequence, even small changes in the resonator mode amplitude can result in quite large changes in acceleration sensitivity.

In a conventional thickness-mode quartz crystal resonator unit, a suitable dimensioned and electrode-carrying blank, platelet, or wafer of quartz, is supported at two or more points on its periphery by metal ribbons or clips. These, in turn, are fastened to a header or base.

Figure 1:
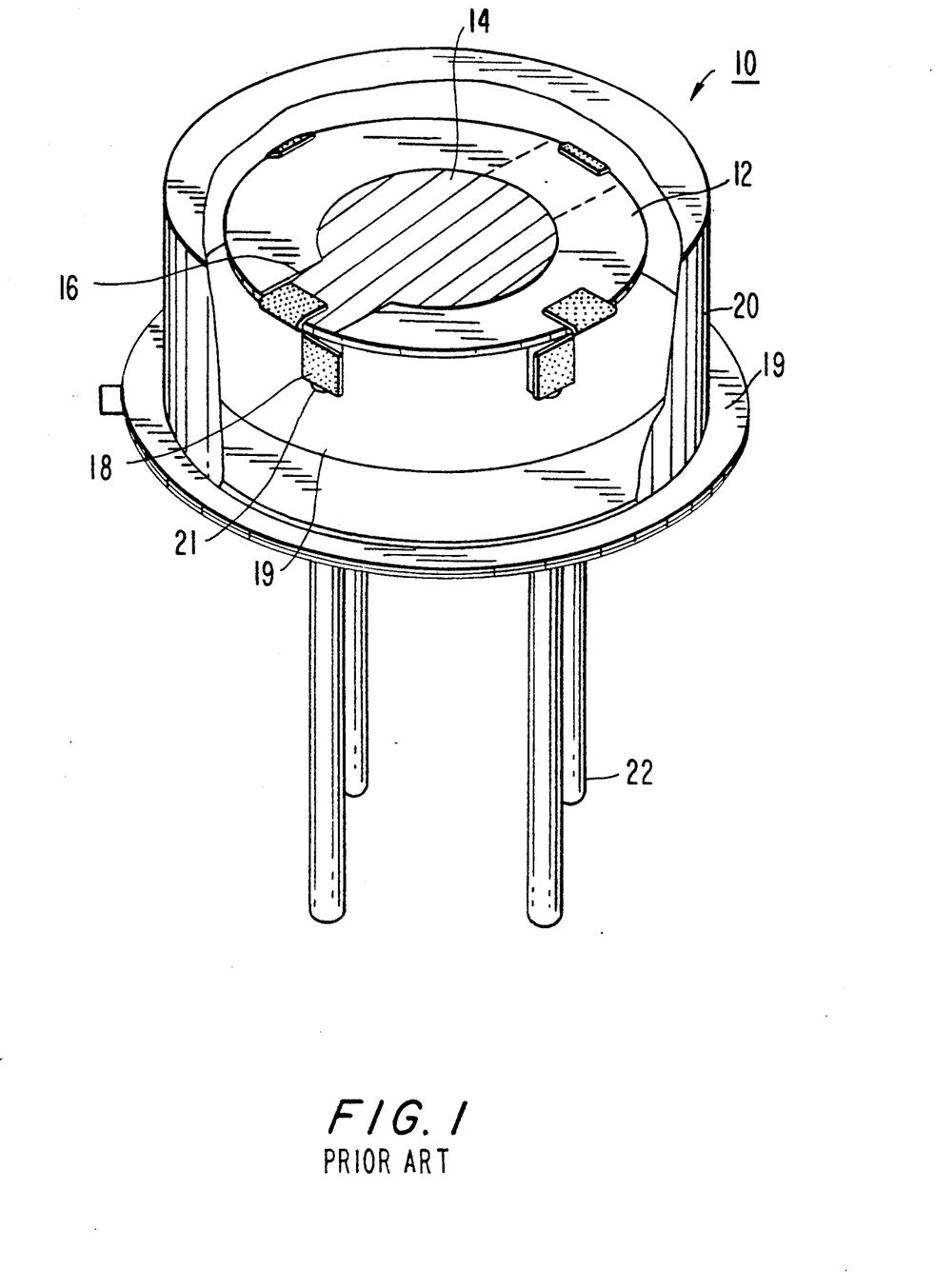
FIG. 1 is an example of a resonator constructed according to the prior art.

FIG. 1 shows a prior art resonator 10 of conventional construction having a circular quartz blank 12 with one or more electrodes 14 thereon, both on the top and bottom of the blank (bottom not shown). Each electrode 14 has an input provided by a terminal 16 which extends to the edge of the blank to which contact is made by a mounting clip 18 mounted to the base 19 of a header 20 through an insulator 21. Mounting pins 22 extend outwardly from the header, each pin making contact with one of the mounting clips 18 in its respectively connected electrode tab terminal 16. The cover 20 is hermetically sealed to the base or header 19. The enclosed volume is often filled with an inert gas such as nitrogen, or may be evacuated.

Under acceleration, the inertial forces on the blank are counteracted by the reaction forces of the support structure. Thus, the support structure directly influences the acceleration-induced deformation of the blank. Because of fabrication and manufacturing limitations, variations in support geometry from resonator to resonator are unavoidable. Since the resonator acceleration sensitivity is the difference of two nearly equal quantities, small changes in the resonator, such as would occur due to normal manufacturing tolerances, can cause large changes in resonator acceleration sensitivity, as is borne out by experience. See the article entitled "The Acceleration Sensitivity of Quartz Crystal Oscillators: A Review "IEEE Transactions On Ultrasonics, Ferroelectrics, and Frequency Control, Vol. 35, No. 3, published in May 1988.

BRIEF DESCRIPTION OF THE INVENTION

The present invention relates to a quartz crystal resonator with reduced acceleration sensitivity. In accordance with the invention, a symmetrical stiffened structure having top and bottom cover plates, which preferably can be of the same material as the active resonator blank, are symmetrically spaced apart from and are rigidly joined to the active resonator blank by sidewalls. In the preferred embodiment of the invention, the stiffened structure is also symmetrically supported to an external mounting device.

The structure of the invention minimizes the acceleration sensitivity by the implementation of two factors. The first is to provide a stiffened overall structure which reduces the acceleration-induced deformation of the active region of the resonator plate and thus tends to reduce the acceleration sensitivity. Second, the stiffened structure provides isolation between the active region of the crystal blank and the mounting clips or ribbons, or other supporting or mounting devices, so that unavoidable variations in mounting geometry do not significantly affect the acceleration sensitivity.

OBJECTS OF THE INVENTION

It is therefore an object of the invention to provide a crystal resonator with reduced acceleration sensitivity.

A further object is to provide a crystal resonator with reduced acceleration sensitivity in which the crystal blank is mounted as part of a symmetrical stiffened structure.

A further object is to provide a crystal resonator with reduced sensitivity in which a stiffened mounting structure is provided for the active crystal blank, which structure includes cover plates mounted on the top and bottom of the active crystal blank.

Another object is to provide a crystal resonator with stiffened cover plates symmetrically mounted to the top and bottom of the active crystal blank and spaced therefrom by sidewalls.

BRIEF DESCRIPTION OF THE DRAWINGS

Other objects and advantages of the present invention will become more apparent upon reference to the following specification and annexed drawings in which.

DETAILED DESCRIPTION OF THE INVENTION

Figure 2:
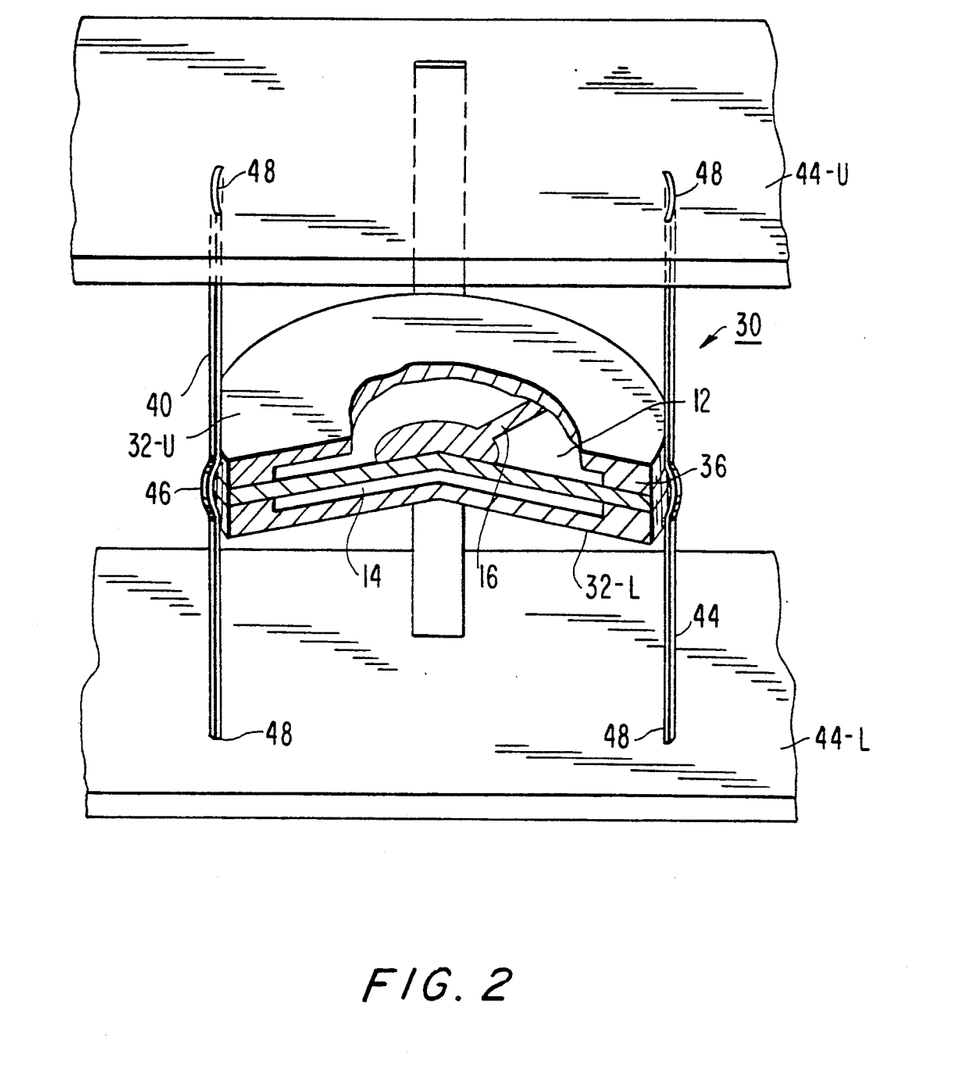
FIG. 2 is a partially cut away perspective view of a resonator made in accordance with the principles of the present invention.
Figure 3:
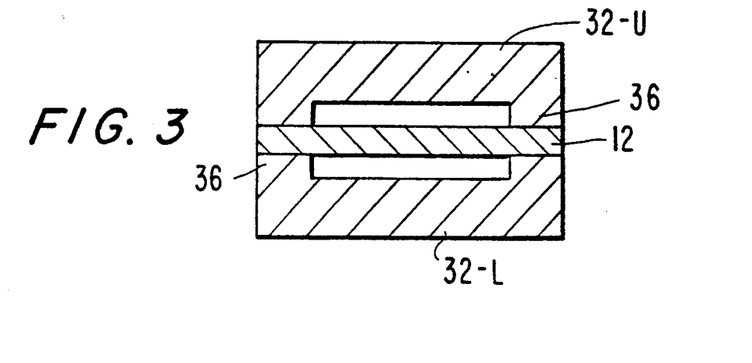
FIG. 3 is a cross-sectional view of the resonator of FIG. 2.
Figure 4:
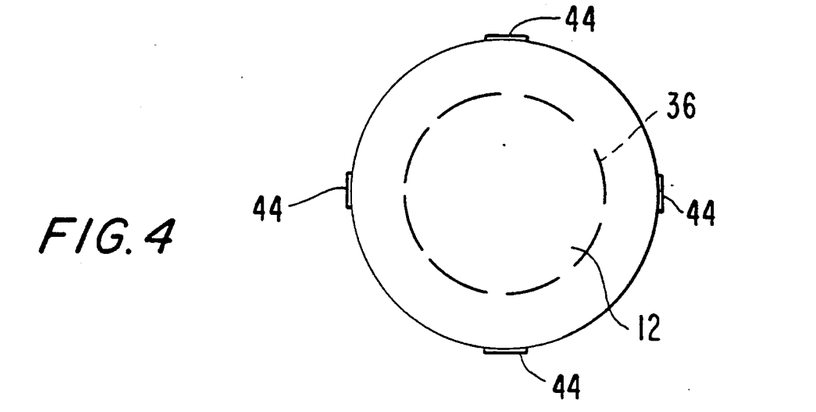
FIG. 4 is a plan view of the resonator of FIGS. 2 and 3.

Referring first to FIGS. 2, 3, and 4, the reduced acceleration sensitivity resonator 30 of the subject invention includes the active crystal blank 12 with the electrode, or electrodes, 14 plated thereon on one or both of the surfaces. The blank 12 can be of quartz or other suitable piezoelectric material. Each electrode 14 has a tab terminal 16 which extends to the edge of blank 12. The active resonator blank 12 and its electrodes are made by any suitable conventional process.

Covering the top and the bottom of the active crystal blank 12 is a cover plate 32-U and 32-L. Cover plates 32-U and 32-L are also preferably of the same material as the active blank 12 so that the entire unit is affected in the same manner by environmental effects. Here they are illustratively of quartz. The cover plates 32 are thick enough to be relatively rigid, that is, their elastic deformation will be small in the environment in which the resonator is to be used.

Each of the cover plates 32-U and 32-L has an annular sidewall 36 around its edge. The sidewalls of both the upper and lower cover plates preferably have the same height. The plates 32 can be made from a thick disc with the inner section milled out to form the annular sidewalls. The sidewalls 36 of the cover plates 32-U and 32-L are mounted to the peripheral edge of the active blank 12 by any suitable means, for example, an epoxy type adhesive. As seen, the structure is symmetrical. If desired, before sealing, the internal portion of the resonator 30 can be exhausted and filled with a suitable inert gas, e.g. nitrogen.

The resonator structure 30 is held between a plurality of elongated mounting clips 40. The clips are spaced equally around the circumferences of the device 30. While four clips 40 are shown, and preferably at least four are used, there can be as few as two clips. Each mounting clip has a curved central section 46 which extends outwardly from its generally straight overall length. As seen, each of the upper and lower ends of the curved section is attached to one of the cover plates. If desired, for example, the mounting clip can be further modified so that, for example, in addition to the curved section 46 at the top end, there is a bent section so that it will conform to the flat surface of the flat outer peripheral surfaces of the plates 32. The mounting portions of the clips 40 are attached to the plates 32 by a suitable adhesive.

At their top and bottom ends 48 the clips 40 are shown connected to upper and lower supports 44 in any desired manner, for example, welding, soldering, staking, etc. The supports 44 can be, for example, the walls of a housing in which device 30 is mounted.

As can be seen in FIGS. 2 and 3, resonator blank 12 is fully supported around its periphery by the stiffening cover plates 32. Since the connection at such peripheral edge is rigid, a rigid mounting is formed completely around the outer edges of each of the upper and lower surfaces of the active blanks 12. If the resonator is subjected to acceleration, the deformation of active blank 12 is reduced due to the clamping effect of the cover plates.

The thicker the cover plates 32 relative to the active blank 12, the more the active blank is protected. That is, the thick cover plates are stiffer and reduce deformation of blank 12 due to acceleration. Consequently, it is preferred that each cover plate 32 should be at least as thick as the thickest region of the active blank 12. In addition, for maximum stiffness, the separation between the active resonator blank 12 and the cover plates should be as small as possible. That is, the height of the side walls 36 should be as small as possible.

Figure 5:
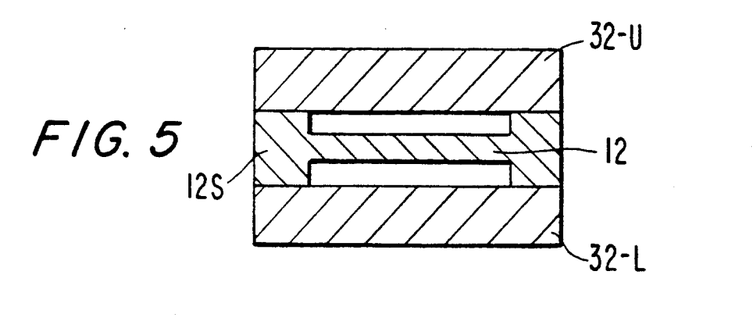
FIG. 5 is a cross-sectional view of another embodiment.

FIG. 5 shows another embodiment of the invention wherein the cover plates 32-U and 32-L are made without the internal sidewalls 36. Instead, here, the active piezoelectric blank 12 is itself made with peripheral sidewalls 12-S which extend from its upper and lower surfaces. In this embodiment, the active blank has its inner section milled, etched or otherwise thinned to form the active section on which the electrodes 14 are plated.

Here, the cover plates 32 are relatively rigid flat discs which are fastened to the sidewalls 12S of the active blank by any suitable means, such as adhesive. The mounting clips 40 (not shown) of FIGS. 2–4 can be used here to mount the device to the supports 44.

Figure 6:
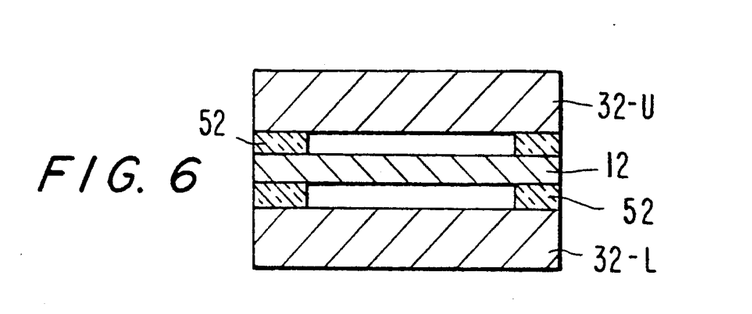
FIG. 6 is a cross-sectional view of still a further embodiment.

FIG. 6 shows another embodiment of the invention wherein the active crystal plate 12 is made without sidewalls as in FIGS. 2–4 as are the upper and lower cover plates 32-U and 32-L as in FIG. 5. Here, separate ring spacers 52 are provided on the upper and lower surfaces of the active crystal blank 12. The ring spacers 52 extend around the periphery of the active crystal blank 12. The ring spacers are connected and attached to the inner surfaces of the support plates 32 and to the outer surfaces of the active crystal blank 12 by any suitable adhesive.

In the cross section of FIG. 6, the sidewalls are separate rings or frames, 52 attached to the cover plates 32 and the resonator blank 12 and may be made of different material. For example, the sidewall rings 52 can be composed of glass frit which also serves to bond the covers 32 to the active plate 12. Alternatively, the sidewalls (rings) 52 can be made of crystalline quartz preferably having the same crystallographic orientation as the resonator blank 12 and covers 32.

Figure 7:
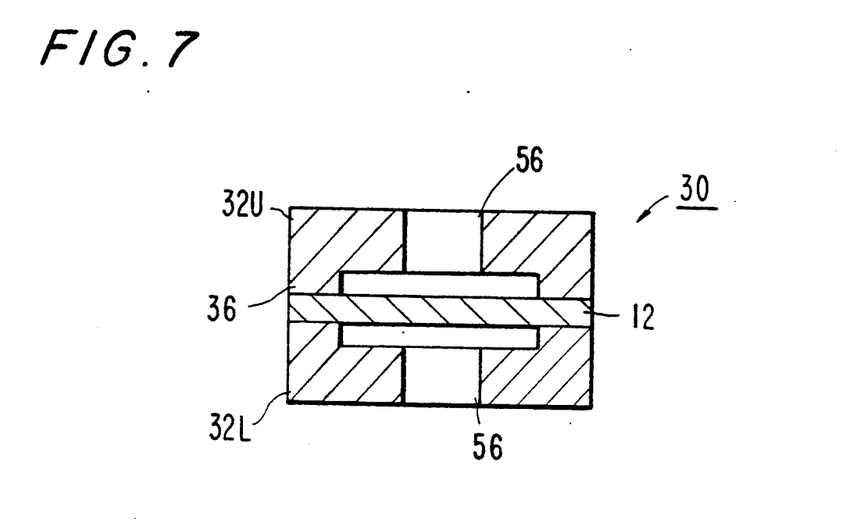
FIGS. 7 and 8 are a cross-sectional and plan view of a modification in which access holes are provided in the cover plates.
Figure 8:
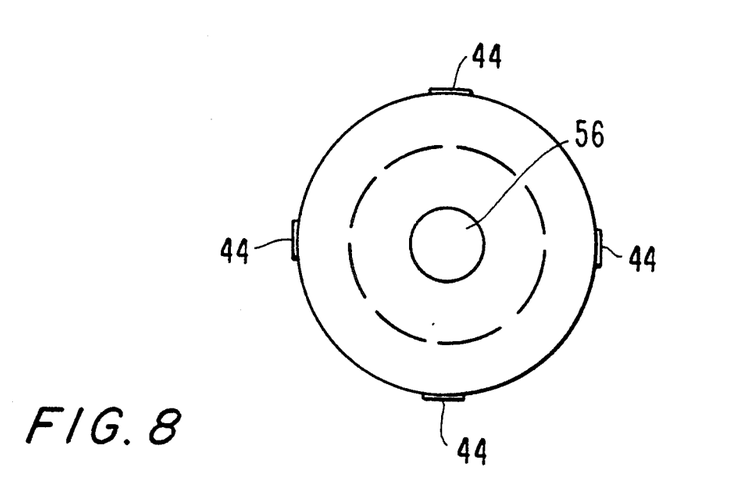

In some cases, it is desirable to have access to the interior of the resonator unit 30. FIGS. 7 and 8 show an arrangement for accomplishing this. Here, the structure is the same as in FIGS. 2–4 in that there are upper and lower support cover plates 32-U and 32-L, each of which has the internal peripheral sidewall 36. In this embodiment, it is preferred that the plates 32 be made somewhat thicker than in FIGS. 2 and 3 and a hole 56 is formed in each of them. The hole 56 provides access to the internal active blank 12 so that, for example, after assembly changes can be made to the electrodes 14 such as by adding additional plating, scraping off part of the plating, etc.

In view of the desirability of symmetry, the openings 56 in each cover plate should be identical. In order to keep the cover plates as stiff as possible, it is preferred that the openings 56 be omitted unless required for purposes such as adjustment, cleaning or evacuation.

Figure 9:
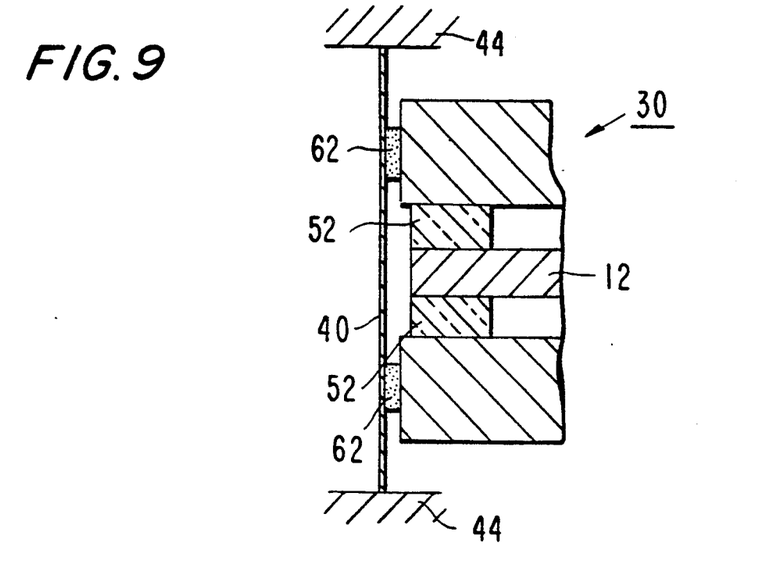
FIG. 9 is a detailed view of FIG. 2 showing the attachment points for the mounting ribbons.
Figure 10:
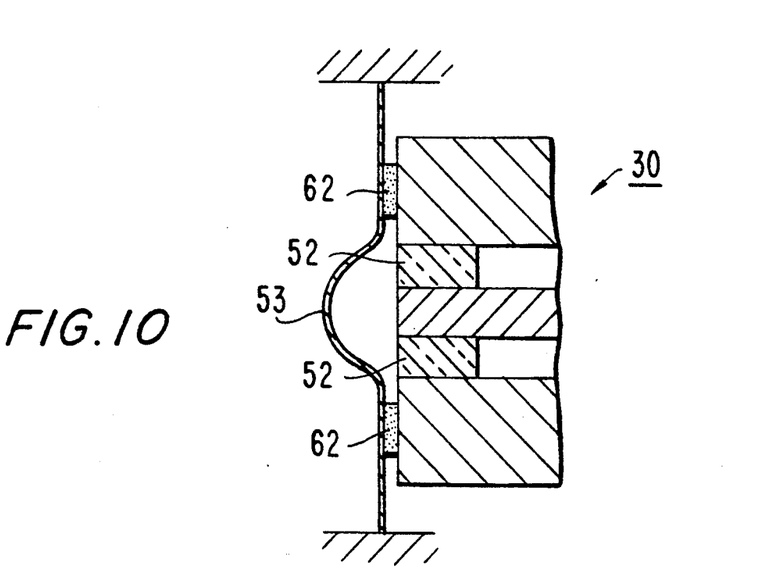
FIG. 10 is a detailed view of another embodiment for the mounting ribbons.

FIGS. 9 and 10 show further embodiments for the mounting clips 40. In FIG. 9 the clips are straight and are attached to the outer periphery of a cover plate by a suitable bonding material or adhesive 62. As seen, the clip is spaced away from the active blank 12. In FIG. 10 the central part of 53 of the support is bent outwardly. The clip 40 is of any suitable material, for example, phosphor bronze, and of suitable thickness so that the unit 30 is rigidly mounted between the external supports 44 which can be, for example, part of a header or housing.

Figure 11:
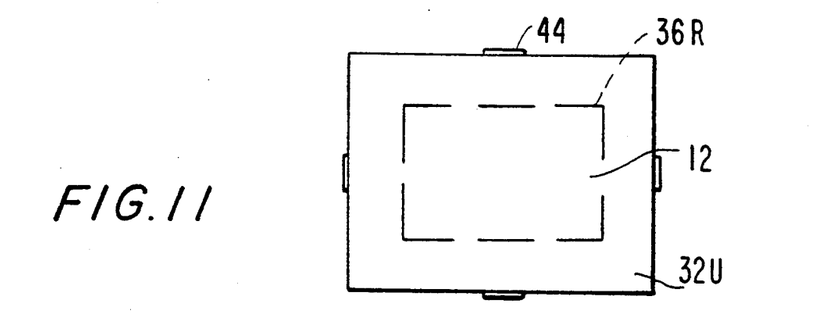
FIG. 11 is a plan view of a resonator with a rectangular blank and cover plates.

It is also preferable to proportion the resonator structures so as to obtain a suitable balance among the appropriate acceleration induced deformation components. It has been shown analytically that for a resonator satisfying certain broad conditions of symmetry, the acceleration sensitivity is exactly zero. See Proceedings of the Forty-Fourth Annual Symposium on Frequency Control—1990, pps. 462–467, entitled "An Analysis of the In-Plane Acceleration Sensitivity of Contoured Quartz Resonators With Rectangular Supports". This was shown specifically for the case of rectangular sidewall 36R supports, i.e. sidewalls whose inner faces form a rectangle as shown in plan view in FIG. 11, As shown in FIG. 11, the active blank is also rectangular, as are the cover plates 32-U and 32-L.

Figure 12:
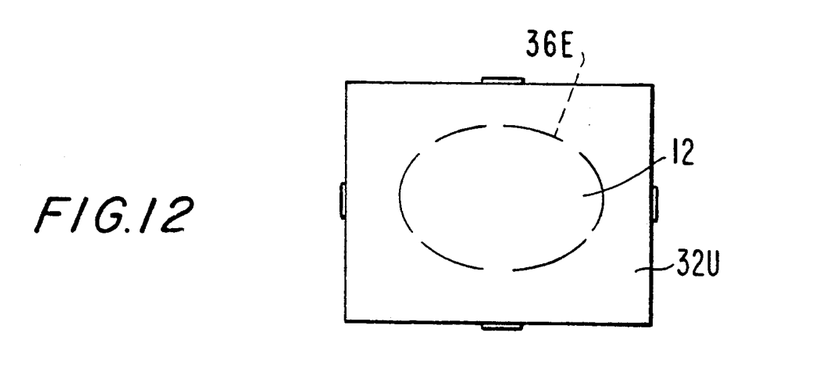
FIG. 12 is a plan view of a resonator and cover plates in which the resonator plate is supported along an elliptical inner perimeter by the sidewalls.

The principles of the invention depend only on the symmetry of the overall structure and apply equally to other configurations possessing the required symmetry such as rectangular active plate 12 supported between rectangular cover plates 32 by sidewalls 36E whose inner walls are elliptical as shown in FIG. 12.

It will be understood that, while the figures do not specifically show resonator blanks which are contoured, the invention encompasses both contoured and plano-plano resonators. Since departures from symmetry in the thickness direction also affect the acceleration sensitivity, it would be preferable to use bi-convex resonators rather than plano-convex. However, for the relatively shallow contours usually employed, plano-convex resonators can be employed with only a small degradation in the acceleration sensitivity. Similarly, for a plano-plano resonator, if the two opposing electrodes have different masses, thickness symmetry is violated and may degrade the acceleration sensitivity. It should also be noted that the electrode tabs may also degrade the lateral symmetry of the configuration somewhat.

As noted earlier, the acceleration sensitivity depends equally upon the acceleration-induced deformation and the mode shape. Therefore, a symmetrical resonant mode shape is desired for realization of low acceleration sensitivity. Thickness-mode resonator blanks, such as AT and SC cut quartz resonators, are ordinarily made to have either plano-plano, plano-convex or bi-convex shape. In each case, the mode shape of the resonator is determined by an energy trapping mechanism.

In plano-plano resonators, the primary controls are the lateral dimensions of the electrodes, including the tabs, the electrode mass loading and the piezoelectric loading. The uniformity of the thickness of the resonator plate also affects the mode shape its symmetry significantly. For plano-convex, bi-convex or other contoured resonators, the symmetry of the mode shape is primarily controlled by the symmetry of the contour with the electrodes having only a secondary effect.

What is claimed is:

1. A symmetrical resonator structure with reduced acceleration sensitivity comprising:
    an active resonator blank having a top surface and a bottom surface, and at least one electrode on each of said top surface and bottom surface,
    top and bottom stiffened cover plates,
    means for mounting said top cover plate at the peripheral edge of said resonator blank above the top surface of said resonator blank and spaced from any electrodes thereon, and for mounting said bottom cover plate at the peripheral edge of said resonator blank below the bottom surface of said resonator blank and spaced away from any electrodes thereon, to form an integral structure therewith which is symmetrical above and below said resonator blank, said top and bottom stiffened cover plates also being symmetrical with respect to each other and about said resonator blank, and
    a plurality of external radially and transversely symmetrical supporting means attached to corresponding locations on a radially outer surface of each of said top and bottom stiffened cover plates and extending outwardly of and transverse to the exposed faces of the cover plates in opposite directions, whereby there is provided an overall fully symmetrical structure to minimize deformation of the resonator blank upon the resonator structure being subjected to physical acceleration.

2. A resonator structure as set forth in claim 1, wherein said mounting means comprises a raised sidewall between the inner face of each said cover plate and the opposed outer surface of said resonator blank, the sidewalls also being symmetrical.

3. A resonator as in claim 1, wherein at least one of the cover plates is at least as thick as the thickest region of the active blank.

4. A resonator structure as in claim 1, wherein the spacings between each of the inner surfaces of the upper and lower cover plates and the corresponding face of the resonator blank are substantially the same.

5. A resonator structure as in claim 2, wherein said mounting means comprises a sidewall on each of said cover plates for engagement with a respective outer surface of said resonator blank.

6. A resonator structure as in claim 2, wherein said mounting means comprises a raised sidewall on the top and bottom surfaces of said resonator blank.

7. A resonator structure as in claim 2, wherein said mounting means comprise separate spacer members between said cover plates and said resonator blank and which are attached to each other to form an integral structure.

8. A resonator structure as in claim 7, wherein said mounting means are of glass material which bonds with the cover plates and resonator blank.

9. A resonator structure as in claim 1, wherein said cover plate and said resonator blank are of the same material.

10. A resonator structure as in claim 1, wherein at least one of said cover plates has an opening therethrough to provide access to the resonator blank.

11. A resonator structure as in claim 10, wherein there is an opening through each of said cover plates.

12. A resonator structure as in claim 1, wherein said resonator blank is planar.

13. A resonator structure as in claim 1, wherein said resonator blank is plano-plano.

14. A resonator structure as in claim 1, wherein said resonator blank has at least one contoured surface.

15. A resonator structure as in claim 14, wherein said contoured surface is concave.

16. A resonator structure as in claim 9, wherein said contoured surface is convex.

17. A resonator structure as in claim 1, wherein said resonator blank and said cover plates are circular.

18. A resonator structure as in claim 1, wherein said resonator blank and said cover plates are rectangular.

19. A resonator structure as in claim 1, wherein said the inner perimeter of each sidewall is elliptical.

* * * * *